United States Patent [19]

Pollard

[11] Patent Number: 4,896,062

[45] Date of Patent: Jan. 23, 1990

[54] ROTATING RECTIFIER ASSEMBLY

[75] Inventor: David D. Pollard, Amanda Township, Lima County, Ohio

[73] Assignee: Westinghouse Electric Corp., Pittsburgh, Pa.

[21] Appl. No.: 201,716

[22] Filed: Jun. 3, 1988

[51] Int. Cl.$^4$ .................. H02K 11/00; H02K 9/19; H01L 23/32

[52] U.S. Cl. .................. 310/68 D; 310/54; 310/60 A; 357/76; 357/81; 363/141; 363/145

[58] Field of Search .................. 310/54, 60 A, 68 D, 310/68 R; 322/28, 87; 357/76, 79, 81; 361/385, 387, 396; 363/144, 145, 141

[56] References Cited

U.S. PATENT DOCUMENTS

| | | | |
|---|---|---|---|
| 2,204,916 | 6/1940 | Shotter . | |
| 2,414,287 | 1/1947 | Crever . | |
| 3,412,271 | 11/1968 | Hall | 310/68 |
| 3,436,603 | 4/1969 | Vogt | 357/76 |
| 4,603,344 | 7/1986 | Trommer | 357/76 |
| 4,628,219 | 12/1986 | Troscinski | 310/68 D |
| 4,745,315 | 5/1988 | Terry, Jr. et al. | 310/68 D |
| 4,827,165 | 5/1989 | Nold | 310/68 D |

FOREIGN PATENT DOCUMENTS

85/03390  8/1985  PCT Int'l Appl. .............. 310/68 D

Primary Examiner—Patrick R. Salce
Assistant Examiner—Clayton Emanuello LaBalle
Attorney, Agent, or Firm—R. P. Lenart

[57] ABSTRACT

A rectifier assembly for use in the rotor of an electrical generator is provided with a plurality of generally disc-shaped diode packages arranged in a stack along a common axis. Radial bus bars are positioned between the diode packages and extend radially beyond the diode stack. Electrically and thermally conductive through bolts extend between a pair of end members on opposite ends of the diode stack and are electrically connected to the radial bus bars. Each of the through bolts includes a longitudinal opening for receiving cooling fluid. Selected ones of the through bolts are held in tension between the end members, thereby axially compressing the diode and radial bus bar stack. Spring terminals are provided for electrically connecting the through bolts to an external circuit and the entire assembly is conveniently packaged as a plug in module.

8 Claims, 4 Drawing Sheets

4,896,062

ROTATING RECTIFIER ASSEMBLY

BACKGROUND OF THE INVENTION

This invention relates to rectifier assemblies for use in the rotors of high-speed, brushless, electric generators.

It is well known that the efficiency and reliability of electric generators, such as those used in aircraft power systems, can be improved by eliminating brushes, commutators or collector rings. Typical brushless generators included a pilot generator having a pilot armature winding mounted on the rotor of the machine. AC current induced in this winding is rectified by a rotating rectifier assembly and fed to an exciter field winding on the rotor. Rotation of the exciter field winding is used to induce multiple phase output power in a main winding located in the stator of the machine.

In order to reduce the size and weight of aircraft generators, it is desirable to increase the rotational speed of the rotor. At high operating speeds, prior art rectifier assemblies such as those which used type DO5 diodes located off center with respect to the rotational axis, have been subject to failure as a result of the high forces produced during such rotation.

Because of its position in the electrical circuit between the pilot generator and the rotating field winding, the rectifier assembly should be located within the generator shaft. It should also be at or near the shaft center to minimize rotational forces acting on its various parts. For high speed applications, the shaft should be as small as possible, thereby permitting a reduction of punching inside diameters and a reduction of stresses within the, punchings.

In prior art rectifier assemblies, lead wires from the windings penetrate the shaft to a screw terminal on the end of the rectifier assembly. At high speeds, the associated wires tend to fly outward from the shaft and must be restricted by various clamps and rings. It is therefore desirable to construct a rotating rectifier assembly which is not subject to the above problems associated with prior art rotating rectifier assemblies.

SUMMARY OF THE INVENTION

This invention provides a rotating rectifier assembly which is compact in size and rugged in construction such that it is capable of withstanding the forces associated with high-speed operation. Diodes are mounted along the rotational axis of the assembly and are arranged such that adjacent diodes have a common circuit connection point. Radial bus bars extend between the diodes and are electrically connected to a plurality of through bolts which not only serve as electrical bus bars, but also contain passages for coolant and hold the diode stack in axial compression. A rectifier assembly constructed in accordance with this invention, comprises a plurality of generally disc-shaped diode packages arranged in a stack along the rotational axis of a rotor. Radial bus bars of electrically and thermally conductive material are positioned between the diodes and have a portion which extends radially outward from the stack. A plurality of electrically and thermally conductive through bolts are electrically connected to the radial bus bars and extend between end members positioned at opposite ends of the stack. The through bolts included longitudinal openings for receiving coolant fluid and selected ones of the through bolts are provided with means for placing them in tension between the end members, thereby axially compressing the diode stack. Means are provided for electrically connecting each of the through bolts to an external circuit.

The rectifier assembly is designed to withstand forces resulting from very high rotational speed by virtue of having its six diodes packaged in small discs which are placed along the center line of the rotating shaft. The assembly is constructed in the form of a plug-in module for easy insertion into the generator shaft. By using its through bolts as interconnecting bus bars to provide both cooling and axial compression of the diode stack, the invention provides a relatively small, light weight assembly.

DESCRIPTION OF THE PREFERRED EMBODIMENT

Figure 1:
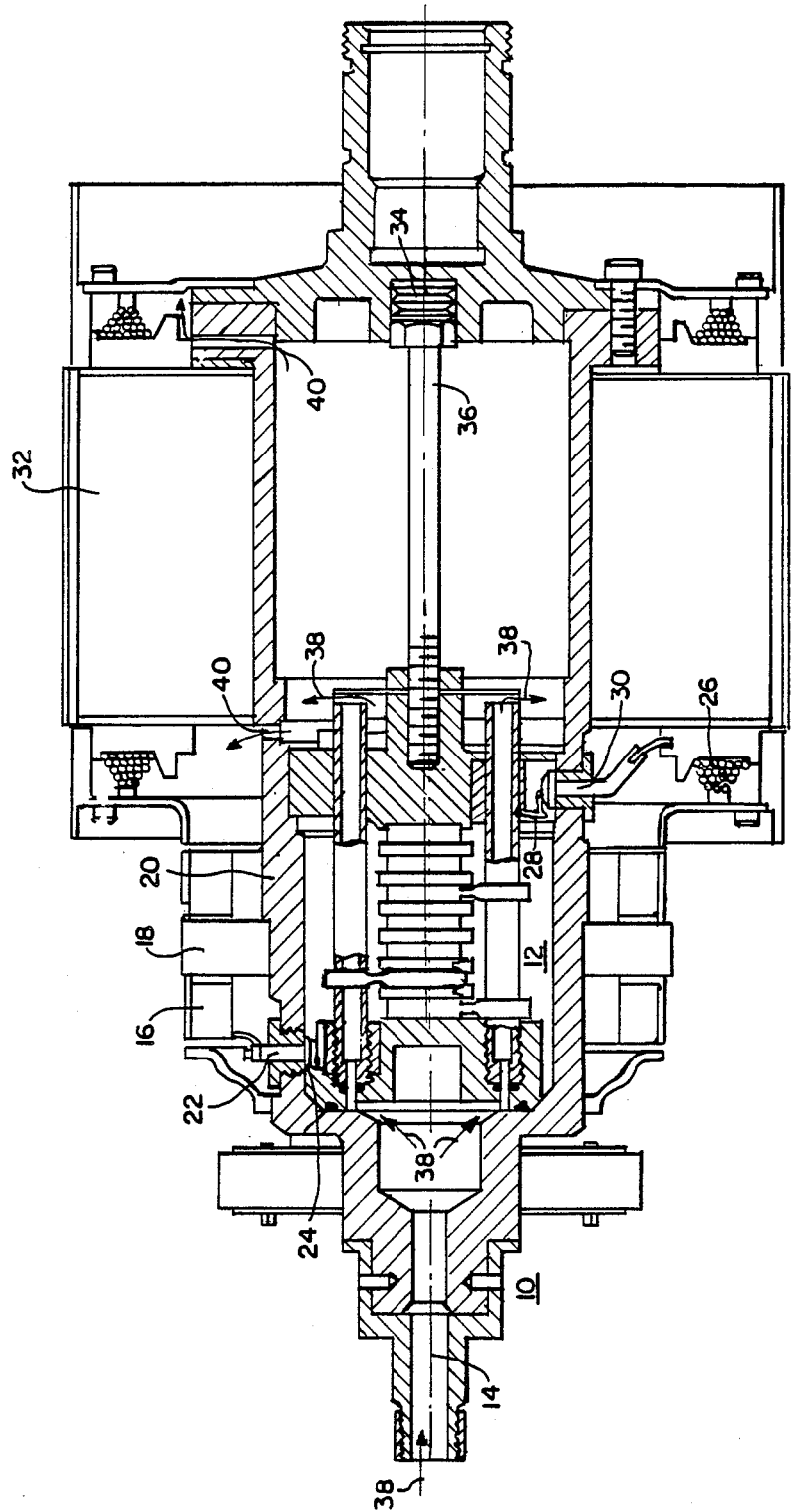
FIG. 1 is a side view, partially in cross-section, of a generator rotor having a rectifier assembly constructed in accordance with one embodiment of the present invention.

Referring to the drawings, FIG. 1 is a side view of a rotor 10 having a rectifier assembly 12 constructed in accordance with one embodiment of the present invention. In operation, the rotor is mounted for rotation about a central axis 14 with respect to a stator, not shown. A pilot generator armature winding 16 is wound around a stack of laminations 18 mounted on shaft 20. As the rotor rotates, the pilot armature winding interacts with a magnetic field, which may be provided by permanent magnets in the stator, resulting in an induced current, which is transferred to the rectifier assembly 12, by way of feed through terminals 22, only one of which is shown. A spring contact 24 on the rectifier assembly 12, electrically connects the assembly to the pilot armature winding. The rectifier assembly then converts the current to a DC current which is fed to an exciter winding 26 by way of spring contact 28 and feed through terminals 30, only one of which is shown. The exciter winding 26 is wound around a second lamination stack 32. A plurality of spring washers 34 are positioned adjacent to bolt 36 for temperature compensation purposes, to keep axial pressure on bolt 36 as the size of the rotor components varies with temperature. A plurality of arrows 38 illustrate the flow of coolant oil through the rotor and rectifier assembly. In FIG. 1, coolant oil enters the left hand end of the rotor shaft and passes through the rectifier assembly. After passing through the rectifier assembly, centripetal force forces the coolant oil through a series of openings 40 onto the exciter field winding.

Figure 2:
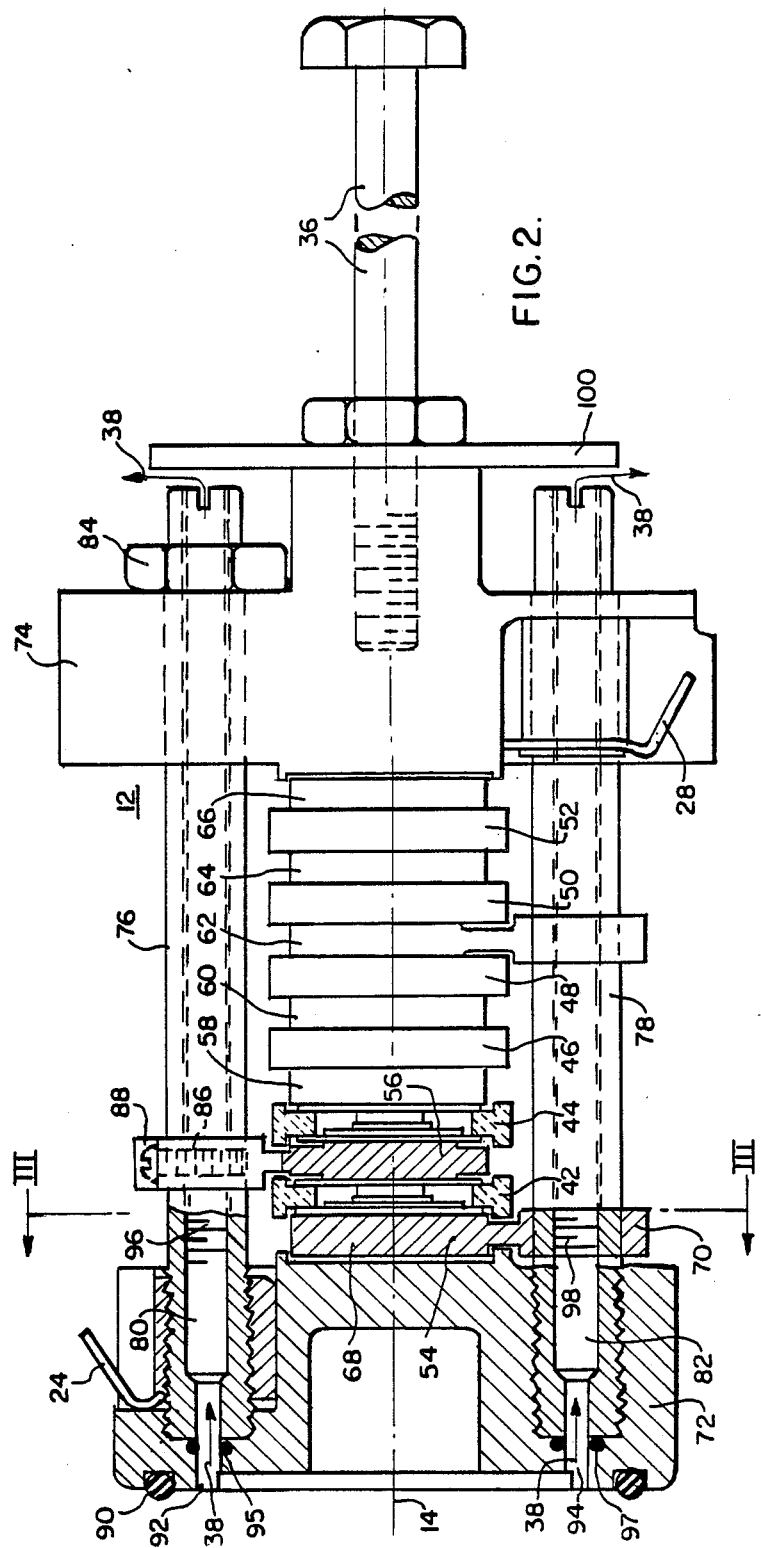
FIG. 2 is a side view, partially in cross-section, of the rectifier assembly of FIG. 1.

FIG. 2 is a side view, partially in cross-section, of the rectifier assembly 12 in FIG. 1. The assembly includes a plurality of generally disc-shaped diode packages 42, 44, 46, 48, 50 and 52 arranged in a stack along axis 14. A plurality of radial bus bars 54, 56, 58, 60, 62, 64 and 66, formed of electrically and thermally conductive material, each include a first portion 68 positioned adjacent to at least one of the diode packages along the axis and a second portion 70 extending radially outward from the stack. First and second end members 72 and 74 are positioned at opposite ends of the diode and bus bar stack.

A plurality of electrically and thermally conductive through bolts 76 and 78, extend between the first and second end members. Each of the through bolts includes a longitudinal opening 80 and 82 for receiving cooling fluid. Selected ones of the through bolts are placed in tension between the first and second end members by means of nuts 84. This places the stack of diode packages and radial bus bars in axial compression. Each radial bus bar includes means for electrically connecting the bus bar to one of the through bolts, in the form of an aperture 86 and a screw 88 for clamping a portion of the through bolt within the aperture. Spring contacts 24 and 28 provide means for electrically connecting the through bolts to an external circuit.

The first end member 72 includes a circular slot for receiving an O-ring 90 and a plurality of coolant passages 92 and 94 in line with the longitudinal openings of the through bolts. O-rings 95 and 97 provide a seal between end member 72 and the ends of through bolts 76 and 78. The longitudinal through bolts further include internal threads 96 and 98 which create additional turbulence within the coolant fluid to improve cooling efficiency. A disc 100 is positioned adjacent to the second end member and extends radially beyond the longitudinal openings of the through bolts to direct the cooling fluid in a generally radial direction after it exits the longitudinal openings of the through bolts.

Figure 3:
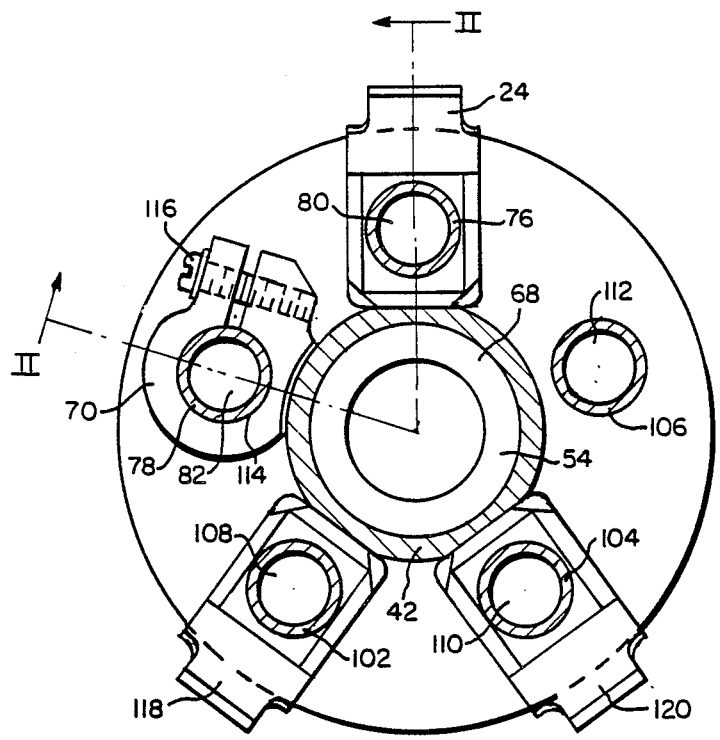
FIG. 3 is a cross-section of the assembly of FIG. 2 taken along line III—III.

FIG. 3 is a cross-section of the rectifier assembly of FIG. 2 taken along line III—III. In this figure, the assembly can be seen to include five through bolts 76, 78, 102, 104 and 106. These through bolts include longitudinal openings 80, 82, 108, 110 and 112 respectively. The radial bus bar 54 is shown to include a first portion 68, axially aligned with the diode stack, and a second portion 70, extending radially outward from the diode stack. The second portion includes an aperture 114 for receiving through bolt 78 and a screw 116 for clamping the through bolt within the aperture. Additional spring contacts 118 and 120 are shown to be electrically connected to through bolts 102 and 104.

Figure 4:
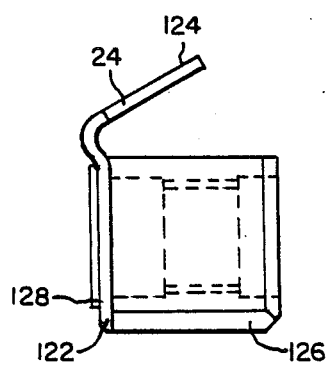
FIGS. 4 and 5 are side and end views of the electrical connections used in the assembly of FIG. 2.
Figure 5:
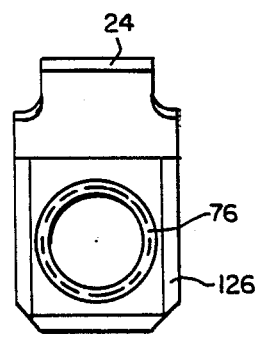

FIGS. 4 and 5 show side and end views of one of the spring contact assemblies. Each spring contact 24, includes a spring washer having a first portion 122 encircling one of the through bolts and a second portion 124 which is resilient in a generally radial direction. A nut 126 is threaded onto one of the through bolts and includes a portion 128 which is rolled onto the circular portion 122 of the spring contact, thereby mechanically securing it to the nut.

Figure 6:
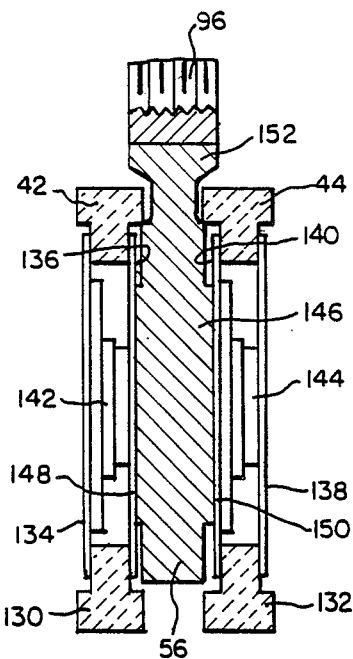
FIG. 6 is a cross-section of a portion of one of the radial bus bars and two of the diode packages of the assembly of FIG. 2.

FIG. 6 is a cross-section of a portion of one of the radial bus bars 56 and two of the diode packages 42 and 44 of FIG. 2. The diode packages include ceramic rings 130 and 132. Each of which creates oppositely faced recesses for receiving diode package face members 134, 136, 138 and 140. Semiconductor material 142 and 144 is disposed between the face members of each respective diode package. A first portion 146 of radial bus bar 56 is positioned along the same axis as the diode packages and includes a pair of protrusions 148 and 150. Each of which extends into one of the recesses of an adjacent diode package and is in electrical and thermal contact with the diode package face member within that recess. A second portion 152 of the radial bus bar 56 extends radially outward from the diode and bus bar stack.

Figure 7:
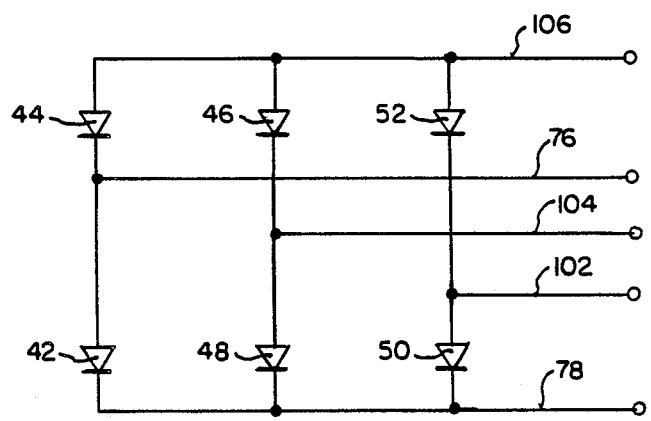
FIG. 7 is a schematic diagram which illustrates the electrical connections provided by the assembly of FIG. 2.

FIG. 7 is a schematic diagram which illustrates the electrical connections of the components of the rectifier assembly of FIGS. 2 and 3.

It should now be apparent that the present invention provides a rotating rectifier assembly having a plurality of diodes packaged in discs and arranged along the center line of a rotating shaft to minimize forces on the diodes created by rotation of the assembly. In the preferred embodiment, electrical connections to the diode pole faces are provided via pressure contacts. The pressure is provided by three of the five through bolts which also serve as bus bars. The diode packages are arranged so that adjacent diodes have commonality of circuit. Radial bus bars between the diodes carry current and heat radially outward to the five through bolt bus bars. Electrical and thermal connection between the radial bus bars and the through bolts is provided by a compression connection using a small screw to provide the compression force.

Cooling fluid or oil is made to pass through drilled and tapped holes in the center of the five through bolts. This cooling technique is preferred over an alternate method when the whole assembly would be flooded with coolant oil because of the high hydraulic pressures that would have to be withstood at high speed rotation. The center openings in the through bolts are tapped to increase cooling effectiveness. After the coolant has passed through the bolts, it is sprayed radially outward to impinge upon a raised ring on the shaft inside diameter. From there, the coolant is centrifuged outward until it reaches spray nozzles for cooling the rotating field windings.

The entire rectifier assembly plugs into the shaft as shown in FIG. 1. Electrical connections are made by spring contacts which make a circuit to five feed through terminals which connect to a contact similar to those found on power relays. The assembly is polarized by the feed through terminals used for connection to the field and is held in place by a bolt that is spring loaded against a stub shaft.

Although the present invention has been described in terms of what is at present believed to be its preferred embodiment, it would be apparent to those skilled in the art that various changes may be made without departing from the scope of the invention. It is therefore intended that the appended claims cover such changes.

What is claimed is:

1. A rectifier assembly for use in the rotor of an electric generator, said assembly comprising:
   a plurality of generally disk-shaped diode packages arranged in a stack on a common axis;
   a plurality of radial bus bars, formed of electrically and thermally conductive material, each of said radial bus bars having a first portion positioned adjacent to at least one of said diode packages along said axis and a second portion extending radially outward from said stack;
   first and second end members positioned at opposite ends of said stack;
   a plurality of electrically and thermally conductive through bolts extending between said first and second end members;
   each of said through bolts including a longitudinal opening for receiving cooling fluid;

means for placing selected ones of said through bolts in tension between said first and second end members, thereby axially compressing said stack;

means for electrically connecting each of said radial bus bars to one of said through bolts; and means for electrically connecting each of said through bolts to an external circuit.

2. A rectifier assembly as recited in claim 1, wherein said means for electrically connecting each of said radial bus bars to one of said through bolts comprises:

an aperture in each of said second portions of said radial bus bars for receiving one of said through bolts; and means for clamping a portion, of said one through bolt within said aperture.

3. A rectifier assembly as recited in claim 1, wherein said means for electrically connecting each of said through bolts to an external circuit comprises:

a plurality of spring contacts, being resilient in a generally radial direction; and means for electrically and mechanically connecting each of said spring contacts to one of said through bolts.

4. A rectifier assembly as recited in claim 3, wherein each of said spring contacts comprises a spring washer encircling one of said through bolts, and said means for electrically and mechanically connecting each of said spring contacts to one of said through bolts comprises:

a nut threaded onto one of said through bolts, wherein a portion of said nut is rolled onto a portion of said spring washer.

5. A rectifier assembly as recited in claim 1, wherein each of said through bolts includes:

a plurality of threads lining said longitudinal opening.

6. A rectifier assembly as recited in claim 1, wherein said first end member includes:

a plurality of coolant passages, each of said coolant passages being in line with the longitudinal opening of one of said through bolts.

7. A rectifier assembly as recited in claim 6, further comprising:

a disk positioned adjacent to said second end member and extending radially beyond the longitudinal openings in each of said through bolts.

8. A rectifier assembly as recited in claim 1, wherein:

each of said diode packages includes a pair of oppositely facing recesses; and each of said first portions of said radial bus bars includes a protrusion extending onto one of said recesses.

* * * * *